(12) United States Patent
Kageyama et al.

(10) Patent No.: US 11,577,958 B2
(45) Date of Patent: Feb. 14, 2023

(54) ZIRCONIUM NITRIDE POWDER AND METHOD FOR PRODUCING SAME

(71) Applicant: MITSUBISHI MATERIALS ELECTRONIC CHEMICALS CO., LTD., Akita (JP)

(72) Inventors: Kensuke Kageyama, Akita (JP); Takashi Konishi, Akita (JP)

(73) Assignee: MITSUBISHI MATERIALS ELECTRONIC CHEMICALS CO., LTD., Akita (JP)

( * ) Notice: Subject to any disclaimer, the term of this patent is extended or adjusted under 35 U.S.C. 154(b) by 658 days.

(21) Appl. No.: 16/336,634

(22) PCT Filed: Sep. 6, 2017

(86) PCT No.: PCT/JP2017/032037
§ 371 (c)(1),
(2) Date: Mar. 26, 2019

(87) PCT Pub. No.: WO2018/061666
PCT Pub. Date: Apr. 5, 2018

(65) Prior Publication Data
US 2020/0198969 A1 Jun. 25, 2020

(30) Foreign Application Priority Data

Sep. 29, 2016 (JP) ............... JP2016-191425

(51) Int. Cl.
*C01B 21/076* (2006.01)
*G03F 7/004* (2006.01)

(52) U.S. Cl.
CPC .......... *C01B 21/076* (2013.01); *G03F 7/0047* (2013.01); *C01P 2006/12* (2013.01); *C01P 2006/60* (2013.01)

(58) Field of Classification Search
CPC ........ C01B 21/076; G03F 7/0047; G03C 1/00
See application file for complete search history.

(56) References Cited

U.S. PATENT DOCUMENTS 3,311,481 A    3/1967 Sterry et al.
3,459,546 A *  8/1969 Lambert ............. C22C 32/0068
                                                          419/57

(Continued)

FOREIGN PATENT DOCUMENTS

CN    1546370 A    11/2004
CN    1912743 A    2/2007

(Continued)

OTHER PUBLICATIONS

Tsutomu Ikeda, Tadaaki Mori, Takeaki Iida, Takashi Mitamura, Preparation of Zirconium Nitride Ultrafine Powder from Zirconium Oxide, Journal of the Ceramic Association, Japan, 1985, vol. 93, Issue 1074, pp. 108-109, Released Apr. 30, 2010, Online ISSN 1884-2127 (Year: 1985).*

(Continued)

*Primary Examiner* — Peter L Vajda
*Assistant Examiner* — Jayson D Cosgrove
(74) *Attorney, Agent, or Firm* — Greenblum & Bernstein, P.L.C.

(57) ABSTRACT

A zirconium nitride powder which has a specific surface area of 20 to 90 $m^2/g$ as measured by a BET method, has a peak corresponding to zirconium nitride but does not have a peak corresponding to zirconium dioxide, a peak for lower zirconium oxide or a peak corresponding to lower zirconium oxynitride in an X-ray diffraction profile, and the light transmittance X at 370 nm is at least 18%, the light transmittance Y at 550 nm is 12% or less and the ratio (X/Y) of the light transmittance X at 370 nm to the light transmittance Y at 550 nm is 2.5 or more in the transmission spectra of a (Continued)

dispersion that contains the powder at a concentration of 50 ppm.

7 Claims, 2 Drawing Sheets

(56) References Cited

U.S. PATENT DOCUMENTS

| | | | |
|---|---|---|---|
| 3,709,706 A * | 1/1973 | Sowman | C04B 35/48 |
| | | | 501/103 |
| 4,975,260 A | 12/1990 | Imai et al. | |
| 5,211,768 A * | 5/1993 | Preisser | C23C 8/26 |
| | | | 148/230 |
| 5,279,808 A | 1/1994 | Xiapo et al. | |
| 2015/0370162 A1 * | 12/2015 | Chou | G03F 7/105 |
| | | | 252/582 |

FOREIGN PATENT DOCUMENTS

| | | |
|---|---|---|
| CN | 102584302 A | 7/2012 |
| CN | 104176716 A | 12/2014 |
| CN | 104194493 A | 12/2014 |
| EP | 0674599 B1 | 1/1997 |
| JP | S60-186407 A | 9/1985 |
| JP | S63-11507 A | 1/1988 |
| JP | H01-264913 A | 10/1989 |
| JP | H4-6102 A | 1/1992 |
| JP | H8-504396 A | 5/1996 |
| JP | 2008-266045 A | 11/2008 |
| JP | 2009-091205 A | 4/2009 |
| JP | 2009091205 A * | 4/2009 |

OTHER PUBLICATIONS

English translation of JP 2009091205 A, Published Apr. 2009 (Year: 2009).*
International Search Report issued in International Bureau of WIPO Patent Application No. PCT/JP2017/032037, dated Dec. 5, 2017.
Office Action for KR App. No. 10-2019-7007932, dated Jan. 21, 2022 (w/ translation).
EESR for EP App. No. 17855624.7, dated Apr. 14, 2020.
Watanabe et al., "Synthesis of Fine Zirconium Nitride Powders by Floating-Type Reduction-Nitridation of Zirconia Powder", Journal of the Australian Ceramic Society, 36(2):121-125 (2000).
Chau et al., "Microwave plasma synthesis of TiN and ZrN nanopowders", Material Letters, 61:1583-1587 (2007).
Office Action for CN App. No. 201780058547.9, dated Apr. 25, 2022 (w/ partial translation).
Jianhui et al., "Preparation and Friction Behavior of Nano-micro Composite Ceramics", Chinese Doctoral Dissertations & Master's Theses Full-Text Databases, Engineering Science and Technology II. No. 10, Oct. 15, 2012 [cited in CN Office Action listed above].

* cited by examiner

ZIRCONIUM NITRIDE POWDER AND METHOD FOR PRODUCING SAME

TECHNICAL FIELD

The present invention relates to a zirconium nitride powder suitably used as an insulating black pigment and a method for producing the same. More particularly, it relates to a zirconium nitride powder which can form a patterning film with high resolution when forming a black patterning film as a black pigment and has a high light shielding property of the formed patterning film and a method for producing the same. This international application claims priority right based on Japanese Patent Application No. 191425 (Japanese Patent Application No. 2016-191425) filed on Sep. 29, 2016, and the entire contents of Japanese Patent Application No. 2016-191425 are incorporated into this international application.

BACKGROUND ART

This type of a black pigment is used for a black matrix of an image forming element such as a color filter of a liquid crystal display and the like, by dispersing in a photosensitive resin to prepare a black photosensitive composition, applying this composition to a substrate to form a photoresist film, and exposing the photoresist film by a photolithography method to form a patterning film. Since conventional carbon black as a black pigment has conductivity, it is not suitable for applications requiring insulation properties.

Conventionally, as a black pigment with high insulating property, there has been disclosed a high resistance black powder containing a black powder comprising titanium oxynitride having a specific composition also called titanium black, and an insulating powder comprising at least one kind of $Y_2O_3$, $ZrO_2$, $Al_2O_3$, $SiO_2$, $TiO_2$ and $V_2O_5$ (for example, see Patent Document 1). According to this black powder, it is said to be suitable as a black matrix of a color filter since it has a high resistance value and is excellent in light shielding property when it is formed into a black film.

Further, as an insulating black pigment containing zirconium nitride, there is disclosed a fine particle lower zirconium oxide-zirconium nitride composite characterized by having a peak corresponding to lower zirconium oxide and a peak corresponding to zirconium nitride in the X-ray diffraction profile, and a specific surface area of 10 to 60 $m^2/g$ (for example, see Patent Document 2). This fine particle lower zirconium oxide-zirconium nitride composite is produced by the process of sintering a mixture of zirconium dioxide or zirconium hydroxide, magnesium oxide and metallic magnesium in a stream of a nitrogen gas or an inert gas containing a nitrogen gas at 650 to 800° C. The above-mentioned fine particle lower zirconium oxide-zirconium nitride composite can be used as a black fine particle material having low electric conductivity, is said to be used as a fine particle black pigment having lower electric conductivity for a black matrix of displays such as televisions in which carbon black or the like is used, and according to the above-mentioned production method, it is said that the above-mentioned fine particle lower zirconium oxide-zirconium nitride composite can be produced (mass-produced) on an industrial scale.

PRIOR ART DOCUMENTS

Patent Documents

Patent Document 1: JP 2008-266045A (claim 1, paragraph and paragraph [0010])
Patent Document 2: JP 2009-091205A (claim 1, claim 2, paragraph [0015] and paragraph [0016])

SUMMARY OF THE INVENTION

Problems to be Solved by the Invention

However, in the black powder referred to as titanium black disclosed in Patent Document 1 and the fine particle lower zirconium oxide-zirconium nitride composite disclosed in Patent Document 2, when they are used as a black pigment, the black pigment in a photoresist film also shields i-line (wavelength 365 nm) which is ultraviolet rays, when a black photosensitive composition is prepared by increasing the pigment concentration to obtain higher shielding property, a photoresist film is formed by coating this composition on a substrate, and the photoresist film is exposed by a photolithography method to form a black patterning film, so that there are problems that ultraviolet rays do not reach the bottom of the photoresist film, and undercuts occur at the bottom, whereby a patterning film with high resolution cannot be formed.

An object of the present invention is to provide a zirconium nitride powder which can form a patterning film with high resolution when forming a black patterning film as a black pigment and has a high light shielding property of the formed patterning film and a method for producing the same.

Means to Solve the Problems

The present inventors have found that when the peaks of zirconium dioxide, lower zirconium oxide and lower zirconium oxynitride exist in a trace amount in the X-ray diffraction profile, the light shielding property is remarkably lowered, so that a high resolution patterning film cannot be formed when the powder is used for forming a black patterning film as a black pigment, and the light shielding property of the formed patterning film is lowered, whereby they have reached the present invention.

A first aspect of the present invention is a zirconium nitride powder which has a specific surface area of 20 to 90 $m^2/g$ as measured by a BET method, has a peak corresponding to zirconium nitride but does not have a peak corresponding to zirconium dioxide, a peak corresponding to lower zirconium oxide or a peak corresponding to lower zirconium oxynitride in an X-ray diffraction profile, and a light transmittance X at 370 nm is at least 18%, a light transmittance Y at 550 nm is 12% or less and a ratio (X/Y) of the light transmittance X at 370 nm to the light transmittance Y at 550 nm is 2.5 or more in a transmission spectra of a dispersion that contains the powder at a concentration of 50 ppm.

A second aspect of the present invention is an invention based on the first aspect, which is the zirconium nitride powder containing silicon oxide and/or silicon nitride at a ratio of 10.0% by mass or less and having a specific surface area measured by the BET method of 40 to 90 $m^2/g$.

A third aspect of the present invention is a method for producing a zirconium nitride powder which comprises mixing a zirconium dioxide powder or a zirconium dioxide powder onto which silica has been coated, a metallic magnesium powder, and a magnesium nitride powder so that the metallic magnesium becomes a ratio of 2.0 to 6.0-fold mol with respect to the zirconium dioxide, and the magnesium nitride becomes a ratio of 0.3 to 3.0-fold mol with respect to the zirconium dioxide to obtain a mixture, and then sintering the mixture in an atmosphere of a nitrogen gas alone, or a mixed gas of a nitrogen gas and a hydrogen gas, or a mixed gas of a nitrogen gas and an ammonia gas at a temperature of 650 to 900° C., to reduce the zirconium dioxide powder whereby producing the zirconium nitride powder of the first or second aspect.

A fourth aspect of the present invention is an invention based on the third aspect, which is a method for producing the zirconium nitride powder, wherein the zirconium dioxide powder onto which silica has been coated is obtained by mixing the zirconium dioxide powder and a silicate sol-gel solution to prepare a slurry, and drying and pulverizing the slurry.

A fifth aspect of the present invention is an invention based on the third or fourth aspect, which is a method for producing a zirconium nitride powder, wherein the hydrogen gas is contained in an amount of 0 to 40% by volume in the mixed gas of the nitrogen gas and the hydrogen gas, and the ammonia gas is contained in an amount of 0 to 50% by volume in the mixed gas of the nitrogen gas and the ammonia gas.

A sixth aspect of the present invention is a black photosensitive composition containing the zirconium nitride powder of the first or second aspect or the zirconium nitride powder produced by the method of any one of the third to fifth aspects as a black pigment.

A seventh aspect of the present invention is a method for forming a black patterning film using the black photosensitive composition according to the sixth aspect.

Effects of the Invention

The zirconium nitride powder of the first aspect of the present invention has a specific surface area of 20 $m^2/g$ or more, so that it has an effect of suppressing sedimentation when formed into a resist, and it is 90 $m^2/g$ or less, so that it has an effect of possessing sufficient light shielding property. Also, in the X-ray diffraction profile, it has a peak corresponding to zirconium nitride, but it does not have a peak corresponding to zirconium dioxide, a peak corresponding to lower zirconium oxide and a peak corresponding to lower zirconium oxynitride, so that it has characteristics that in the dispersion transmission spectrum of powder concentration of 50 ppm, a light transmittance X at 370 nm is at least 18% and a light transmittance Y at 550 nm is 12% or less, and has a characteristic that X/Y is 2.5 or more. By having X/Y of 2.5 or more, it has a characteristic that ultraviolet rays are further transmitted. As a result, when a black patterning film is formed as a black pigment, a high resolution patterning film can be formed, and the formed patterning film has high light shielding property.

The zirconium nitride powder of the second aspect of the present invention contains silicon oxide and/or silicon nitride at a ratio of 10.0% by mass or less, so that it has an effect of suppressing oxidation. Also, the specific surface area is 40 to 90 $m^2/g$, so that it has an effect of suppressing sedimentation of the resist solution.

In the method for producing the zirconium nitride powder of the third aspect of the present invention, nitriding efficiency of zirconium oxide is remarkably improved since magnesium nitride is used instead of magnesium oxide, as compared with the producing method of Patent Document 2 in which a mixture of a zirconium dioxide powder, a metallic magnesium powder and a magnesium oxide powder is sintered under an atmosphere of a nitrogen gas or an inert gas containing a nitrogen gas. That is, when magnesium oxide is contained as in Patent Document 2, metallic magnesium is partially used for nitriding magnesium oxide, but when magnesium nitride is used as in the present invention, metallic magnesium is used only for nitriding zirconium oxide, and the reaction efficiency is improved.

Further, in the present invention, although the reaction proceeds even with a nitrogen gas alone, by sintering the mixture under an atmosphere of a mixed gas of a nitrogen gas and a hydrogen gas or a mixed gas of a nitrogen gas and an ammonia gas, the reduction reaction is more promoted, the reaction efficiency is more heightened, and only zirconium nitride powder containing no zirconium dioxide, lower zirconium oxide and lower zirconium oxynitride can be produced even with a smaller amount of metallic magnesium. Further, by using a zirconium dioxide powder onto which silica has been coated as a raw material, grain growth can be suppressed at the time of sintering, and a finer zirconium nitride powder can be obtained.

According to the method for producing the zirconium nitride powder of the fourth aspect of the present invention, silica can be coated onto the zirconium dioxide powder more uniformly and conveniently to obtain a raw material of a fine zirconium dioxide powder.

According to the method for producing the zirconium nitride powder of the fifth aspect of the present invention, by containing a hydrogen gas in the mixed gas with a ratio of 0 to 40% by volume, and containing an ammonia gas in the mixed gas with a ratio of 0 to 50% by volume, the reduction reaction is furthermore promoted and the reaction efficiency is further heightened, so that only zirconium nitride powder containing no zirconium dioxide, lower zirconium oxide and lower zirconium oxynitride can be produced even with a smaller amount of metallic magnesium.

According to the black photosensitive composition of the sixth aspect of the present invention, only the zirconium nitride powder is used as the black pigment, so that if the black patterning film is formed by using the composition, a high resolution patterning film can be formed, and yet the formed patterning film becomes to have high light shielding property.

According to the method for forming the black patterning film of the seventh aspect of the present invention, it is possible to form a high resolution patterning film, and the formed patterning film becomes to have high light shielding property.

EMBODIMENTS TO CARRY OUT THE INVENTION

Figure 1:
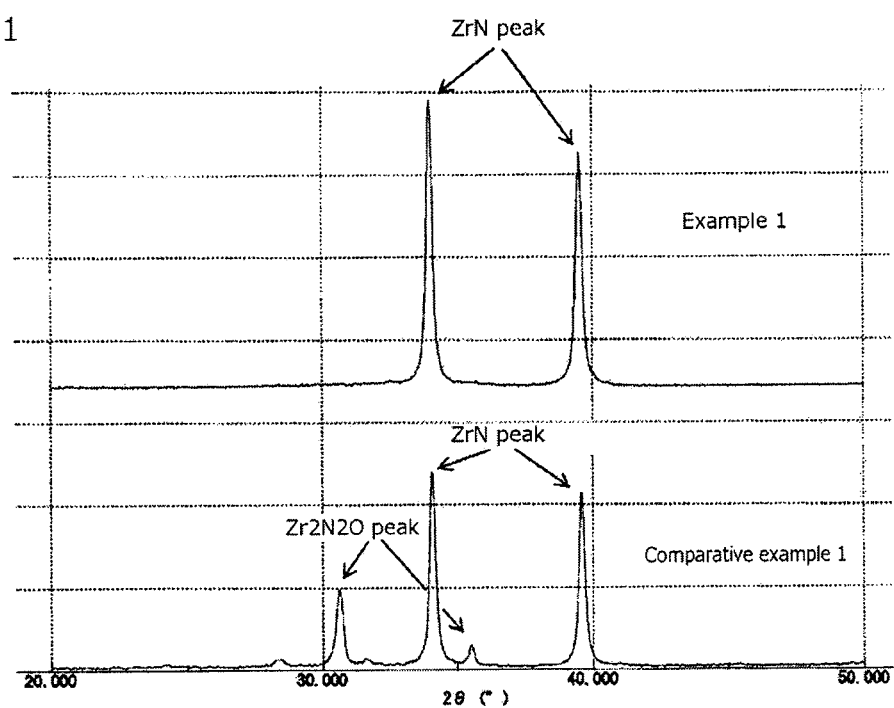
FIG. 1 is an X-ray diffraction profile of the zirconium nitride powder each obtained in Example 1 of the present invention and Comparative example 1.

Next, embodiments to carry out the present invention will be explained.

[Method for Producing ZrN by Sintering ZrO$_2$, Mg$_3$N$_2$ and Metallic Mg as Starting Materials]

The first embodiment of the present invention is a method for producing a zirconium nitride (ZrN) powder which comprises using each powder of zirconium dioxide (ZrO$_2$) or zirconium dioxide (ZrO$_2$) on which silica has been coated, metallic magnesium (metallic Mg) and magnesium nitride (Mg$_3$N$_2$) as raw materials, and sintering them under a specific atmosphere at specific temperature and time to obtain a specific surface area measured by the BET method of 20 to 90 m$^2$/g.

[Zirconium Dioxide Powder]

As the zirconium dioxide powder of this embodiment, for example, any of the powders of monoclinic zirconium dioxide, cubic zirconium dioxide, yttrium stabilized zirconium dioxide or the like can be used, and from the viewpoint of increasing the generation rate of the zirconium nitride powder, monoclinic zirconium dioxide powder is preferred.

Also, each of the average primary particle diameter of the zirconium dioxide powder or the zirconium dioxide powder on which silica has been coated, and the average primary particle diameter of the magnesium oxide powder of this embodiment are preferably 500 nm or less with an average primary particle diameter in terms of the spherical form converted from the measured value of the specific surface area to obtain a zirconium nitride powder having a specific surface area measured by the BET method of 20 to 90 m$^2$/g, and preferably 500 nm or less and 10 nm or more with an average primary particle diameter from the ease of handling of the powder.

[Zirconium Dioxide Powder onto which Silica has been Coated]

The zirconium dioxide powder onto which silica has been coated can be obtained by mixing a zirconium dioxide powder and a silicate sol-gel liquid to prepare a slurry, and drying and pulverizing the slurry. A mixing ratio of the zirconium dioxide and the silicate sol-gel liquid is preferably such that the silica content of the zirconium dioxide: the silicate sol-gel liquid=99.5 to 0.5:90.0 to 10.0 by mass ratio. If the silica content is less than the lower limit value, the silica coverage on the surface of the zirconium dioxide is too low, and if the silica content exceeds the upper limit value, there is inconvenience that the light shielding property is insufficient when a patterning film is formed using the obtained zirconium nitride powder.

It is preferable that the zirconium dioxide powder is charged in a dispersing liquid such as water, an alcohol and the like to mix them, and then the mixed liquid is added to the silicate sol-gel liquid and mixed, since the zirconium dioxide is uniformly mixed with the sol-gel liquid. The silicate sol-gel liquid is preferably a liquid in which a silicate such as methyl silicate, ethyl silicate and the like is dissolved in a solvent such as water, an alcohol and the like. A mixing ratio of the zirconium dioxide and the sol-gel liquid is determined so that a concentration of a solid content of the obtained slurry is 10 to 50% by mass as the solid content. The obtained slurry is dried in air or in a vacuum atmosphere at a temperature of 60 to 120° C. for 1 to 360 minutes to obtain a zirconium dioxide powder onto which silica has been coated.

By using the zirconium dioxide powder onto which silica has been coated as a raw material, grain growth can be suppressed at the time of sintering, and finer zirconium nitride powder having a specific surface area measured by the BET method of 20 to 90 m$^2$/g can be obtained. At this time, the zirconium nitride powder contains silicon oxide and/or silicon nitride at a ratio of 10.0% by mass or less, preferably 9.0% by mass or less. If it exceeds 10.0% by mass, there is inconvenience that the light shielding property is insufficient when a patterning film is formed using the obtained zirconium nitride powder.

[Metallic Magnesium Powder]

If the particle diameter of the metallic magnesium powder is too small, the reaction proceeds rapidly and the risk of operation becomes high, so that it is preferable that the material has the particle diameter of 100 to 1,000 μm in a mesh pass of a sieve and in a granular state, and particularly preferably the material having 200 to 500 μm in a granular state. Provided that even if all the metallic magnesium is not within the above-mentioned range of the particle diameter, it is sufficient if 80% by mass or more thereof, particularly 90% by mass or more may be within the above-mentioned range.

An amount of the metallic magnesium powder to be added to the zirconium dioxide powder affects the reducing power of the zirconium dioxide with amounts of the ammonia gas and the hydrogen gas in the atmospheric gas mentioned later. If the amount of the metallic magnesium is too small, it is difficult to obtain the intended zirconium nitride powder due to insufficient reduction, while if it is too much, the reaction temperature rapidly rises due to excessive metallic magnesium and there is a fear of causing grain growth of the powder which will become uneconomical. The metallic magnesium powder is added to the zirconium dioxide powder to be mixed so that the ratio of the metallic magnesium to the zirconium dioxide may become 2.0 to 6.0-fold mol depending on the size of the particle diameter thereof. If it is less than 2.0-fold mol, the reducing power of the zirconium dioxide will be insufficient, while if it exceeds 6.0-fold mol, the reaction temperature rapidly rises due to excessive metallic magnesium and there is a fear of causing grain growth of the powder which will become uneconomical. It is preferably 3.0 to 5.0-fold mol.

[Magnesium Nitride Powder]

The magnesium nitride powder coats the surface of the zirconium nitride at the time of sintering and relaxes the reducing power of the metallic magnesium to prevent sintering and grain growth of the zirconium nitride powder. The magnesium nitride powder is added to the zirconium dioxide to be mixed so that the ratio of the magnesium nitride to the zirconium dioxide may become 0.3 to 3.0-fold mol depending on the size of the particle diameter thereof. If it is less than 0.3-fold mol, sintering of the zirconium nitride powder will not be prevented, while if it exceeds 3.0-fold mol, there is inconvenience that the amount of the acidic solution used required at the time of acid cleaning after sintering increases. It is preferably 0.4 to 2.0-fold mol. The magnesium nitride powder preferably has an average primary particle diameter of 1,000 nm or less in terms of a spherical shape from the measured value of the specific surface area, and is preferably 500 nm or less and 10 nm or more as the average primary particle diameter from the viewpoint of easiness in handling of the powder. It should be noted that not only magnesium nitride but also magnesium oxide is effective for preventing sintering of zirconium nitride, so it is possible to use magnesium oxide to which magnesium nitride is mixed.

[Reduction Reaction by Metallic Magnesium Powder]

A temperature at the time of reduction reaction by metallic magnesium for forming the zirconium nitride powder of this embodiment is 650 to 900° C., preferably 700 to 800° C. 650° C. is the melting temperature of metallic magnesium, and if the temperature is lower than this, reduction reaction of zirconium dioxide does not occur sufficiently. In addition, even if the temperature is made higher than 900° C., it is not preferable since its effect does not increase, heat energy is lost and sintering of particles proceeds. Also, a time of reduction reaction is preferably 30 to 90 minutes, more preferably 30 to 60 minutes.

A reaction vessel for carrying out the above-mentioned reduction reaction is preferably one having a lid so that raw materials and products are not scattered during the reaction. This is because, when the melting of metallic magnesium is started, the reduction reaction rapidly proceeds, the temperature rises accompanied thereby, the gas inside the vessel expands, and accordingly, there is a fear that the material inside of the vessel scatters to the outside.

[Atmospheric Gas at Reduction Reaction with Metallic Magnesium Powder]

A characteristic feature of the present embodiment resides in the atmospheric gas at the time of the above-mentioned reduction reaction. The atmospheric gas of the present embodiment is a nitrogen gas alone, or a mixed gas of a nitrogen gas and a hydrogen gas, or a mixed gas of a nitrogen gas and an ammonia gas. The above-mentioned reduction reaction is carried out in a stream of the above-mentioned mixed gas. The nitrogen gas in the mixed gas has a role of preventing contact between metallic magnesium or a reduction product and oxygen, whereby preventing their oxidation, and reacting nitrogen with zirconium to generate zirconium nitride. The hydrogen gas or the ammonia gas in the mixed gas has a role of reducing zirconium dioxide together with metallic magnesium. The hydrogen gas is preferably contained in the above-mentioned mixed gas in an amount of 0 to 40% by volume, more preferably 10 to 30% by volume. Also, the ammonia gas is preferably contained in the above-mentioned mixed gas in an amount of 0 to 50% by volume, more preferably 0 to 40% by volume. By using this atmospheric gas having a reducing power, a zirconium nitride powder containing no lower zirconium oxide and lower zirconium oxynitride can be finally produced. On the other hand, if the ratio of the hydrogen gas or the ratio of the ammonia gas is higher than this range, the reduction proceeds but the nitrogen source becomes small so that lower zirconium oxide or lower zirconium oxynitride is generated, which is not desirable. In addition, the reason why the ratio of the ammonia gas is higher than the ratio of the hydrogen gas is considered that ammonia has higher nitriding ability as the gas than that of hydrogen.

[Treatment of Reactants After Sintering]

The reactant obtained by sintering the mixture of the zirconium dioxide powder or the zirconium dioxide powder onto which silica has been coated, the magnesium oxide powder and metallic magnesium under the atmosphere of the above-mentioned mixed gas is taken out from the reaction vessel and, finally, after cooling to room temperature, washed with an acid solution such as an aqueous hydrochloric acid solution and the like to remove magnesium oxide generated by oxidation of the metallic magnesium or magnesium oxide contained from the beginning of the reaction for preventing sintering of the product. With regard to this acid washing, it is preferable to carry out at a pH of 0.5 or more, particularly at a pH of 1.0 or more, and a temperature of 90° C. or lower. This is because there is a fear of eluting zirconium if the acidity is too strong or the temperature is too high. Then, after the acid washing, the pH is adjusted to 5 to 6 with aqueous ammonia or the like, the solid content is separated by filtration or centrifugal separation, and the solid content is dried and pulverized to obtain a zirconium nitride powder.

In this embodiment, the zirconium nitride powder using metallic magnesium is mainly described, and it is also possible to produce this zirconium nitride powder by nanoparticle plasma synthesis method. Specifically, it is a method in which a metallic zirconium powder is introduced into a plasma nanoparticle manufacturing apparatus, zirconium nitride nanoparticles are obtained under an $N_2$ gas atmosphere. The zirconium nitride synthesized by this method can also have a specific surface area measured by the BET method of 20 to 90 $m^2/g$ which is the same as that in the present embodiment, but there are disadvantages that the metallic zirconium as a raw material has high flammability and danger, and it is costly to increase.

<Characteristics of Zirconium Nitride Powder Obtained by Present Embodiment>

The zirconium nitride powder obtained by present embodiment has a specific surface area measured by the BET method of 20 to 90 $m^2/g$. If the above-mentioned specific surface area of the zirconium nitride powder is 20 $m^2/g$ or less, when a black resist is formed, there is a defect that the pigment sediments at the time of long-term storage, while if it exceeds 90 $m^2/g$, when a patterning film is formed as a black pigment, there is a defect that light shielding property is insufficient. It is preferably 30 to 60 $m^2/g$.

The zirconium nitride powder has, in the dispersion transmission spectrum of powder concentration with 50 ppm, a light transmittance X at 370 nm of at least 18%, that is, 18% or more, and a light transmittance Y at 550 nm is 12% or less. If the light transmittance X is less than 18%, when the patterning film is formed as a black pigment, the bottom portion of the photoresist film is not exposed, and undercut of the patterning film occurs. Also, if the light transmittance Y exceeds 12%, light shielding property of the formed patterning film is insufficient and high OD value cannot be obtained. Preferable light transmittance X is 19% or more, and preferable light transmittance Y is 8% or less. Taking into account the trade-off characteristics of the above-mentioned light transmittance X and the light transmittance Y, the zirconium nitride powder of the present embodiment has (X/Y) of 2.5 or more, preferably 3.0 or more which is ratio of the light transmittance Y at 550 nm to the light transmittance X at 370 nm. That is, by being X/Y of 2.5 or more, there is an effect of ultraviolet ray transmission, and priority is given to not causing undercut of the patterning film.

[Method for Forming Patterning Film using Zirconium Nitride Powder as Black Pigment]

A method of forming a patterning film represented by a black matrix using the above-mentioned zirconium nitride powder as a black pigment will be described. First, the above-mentioned zirconium nitride powder is dispersed in a photosensitive resin to prepare a black photosensitive composition. Then, the black photosensitive composition is coated onto a substrate, and then, prebaking is carried out to evaporate the solvent to form a photoresist film. Next, the photoresist film is exposed to a prescribed pattern shape through a photomask, then, developed with an alkali developing solution to dissolve and remove the unexposed portion of the photoresist film, thereafter post-baking is preferably carried out whereby a predetermined black patterning film is formed.

As an index representing a light shielding property (attenuation of transmittance) of the formed patterning film, an optical density, i.e., an OD (Optical Density) value has been known. The patterning film formed by using the zirconium nitride powder of the present embodiment has a high OD value. Here, the OD value is a logarithmic representation of the degree of absorption of light as it passes through the patterning film, and is defined by the following equation (1). In the equation (1), I is a transmitted light quantity, and $I_0$ is an incident light quantity.

$$OD\ value = -\log_{10}(I/I_0) \qquad (1)$$

As the above-mentioned substrate, for example, there may be mentioned glass, silicon, polycarbonate, polyester, aromatic polyamide, polyamideimide, polyimide, and the like. In addition, to the above-mentioned substrate, if desired, an appropriate pretreatment such as chemical treatment with a silane coupling agent, and the like, plasma treatment, ion plating, sputtering, gas phase reaction method, vacuum vapor deposition or the like may be applied. When the black photosensitive composition is to be applied to a substrate, an appropriate coating method such as spin coating, cast coating, roll coating or the like can be adopted. A thickness of the coating is, as a thickness after drying, in general, 0.1 to 10 µm, preferably 0.2 to 7.0 µm, more preferably 0.5 to 6.0 µm. As the radiation used when the patterning film is formed, in the present embodiment, radiation having a wavelength in the range of 250 to 370 nm is preferable. An irradiation energy quantity of the radiation is preferably 10 to 10,000 J/m². Also, as the above-mentioned alkali developing solution, for example, an aqueous solution of sodium carbonate, sodium hydroxide, potassium hydroxide, tetramethylammonium hydroxide, choline, 1,8-diazabicyclo-[5.4.0]-7-undecene, 1,5-diazabicyclo-[4.3.0]-5-nonene, and the like are preferable. To the above-mentioned alkali developing solution, for example, a suitable amount of a water-soluble organic solvent such as methanol, ethanol or the like, or a surfactant or the like may be added. Incidentally, after alkali development, it is usually washed with water. As the developing treatment method, a shower development method, a spray development method, a dipping (immersion) development method, a paddle (liquid filling) development method and the like can be applied, and the development condition is preferably for 5 to 300 seconds at room temperature. The patterning film thus formed can be suitably used for a high precision liquid crystal, a black matrix material for organic EL, a light shielding material for an image sensor, a light shielding material for an optical element, alight shielding filter, an IR cut filter, and the like.

EXAMPLES

Next, Examples of the present invention will be explained in detail together with Comparative examples.

Example 1

To 7.4 g of a monoclinic zirconium dioxide powder having an average primary particle diameter calculated from the specific surface area measured by the BET method of 50 nm were added 7.3 g of metallic magnesium powder having an average primary particle diameter of 150 µm and 3.0 g of a magnesium nitride powder having an average primary particle diameter of 200 nm, and uniformly mixed by a reaction apparatus in which a graphite boat has been internally amounted in a glass tube made of quartz. At this time, an amount of the metallic magnesium added was 5.0-fold mol of that of the zirconium dioxide, and an amount of the magnesium nitride was 0.5-fold mol of that of the zirconium dioxide. This mixture was sintered under an atmosphere of a nitrogen gas at a temperature of 700° C. for 60 minutes to obtain a sintered product. This sintered product was dispersed in 1 liter of water, and 10% hydrochloric acid was gradually added thereto to wash the same at a pH of 1 or more while maintaining the temperature to 100° C. or lower, and then adjusted to a pH of 7 to 8 with 25% aqueous ammonia and filtered. The filtered solid content was redispersed in water with 400 g/liter, and once again, acid washing and pH adjustment with aqueous ammonia were carried out in the same manner as mentioned above, followed by filtration. Thus, acid washing-pH adjustment with aqueous ammonia was repeated twice, then, the filtrate was dispersed in ion exchange water with 500 g/liter in terms of the solid content, and after subjecting to stirring under heating at 60° C. and adjustment of a pH to 7, it was filtered by a suction filtering apparatus, further washed with an equal amount of ion exchange water, and dried with a hot air dryer at a set temperature of 120° C. to obtain a zirconium nitride powder.

Example 2

In the same manner as in Example 1 except that the same metallic magnesium powder as in Example 1 was changed to 4.4 g (3.0-fold mol of zirconium dioxide), the reaction gas was changed to a mixed gas of a nitrogen gas and a hydrogen gas, the atmosphere was made to be the mixed gas with a ratio of these ($N_2$:$H_2$) in terms of % by volume of 90%:10%, and the sintering time was set to be 30 minutes, a zirconium nitride powder was produced.

Example 3

In ethanol was dispersed 7.4 g of the same zirconium dioxide powder as in Example 1, and the mixed liquid was added to the silicate sol-gel liquid (silica content: 0.1522 g) containing ethyl silicate as a main component and mixed to prepare a slurry having a solid content concentration of 30% by mass. This slurry was dried in a box type dryer under air atmosphere at a temperature of 70° C. for 120 minutes to obtain a zirconium dioxide powder having an average primary particle diameter of 50 nm onto which silica has been coated. In the powder, silica ($SiO_2$) was contained in an amount of 3.0% by mass in the zirconium dioxide. To 7.5 g of the zirconium dioxide powder were added 8.8 g of a metallic magnesium powder having an average primary particle diameter of 300 µm and 2.1 g of a magnesium nitride powder having an average primary particle diameter of 500 nm, and uniformly mixed in the same manner as in Example 1. At this time, an amount of the metallic magnesium added was 6.0-fold mol of that of the zirconium dioxide, and an amount of the magnesium nitride added was 2.0-fold mol of that of the zirconium dioxide. Thereafter, a zirconium nitride powder was obtained in the same manner as in Example 1.

Example 4

Amounts of the metallic magnesium and the magnesium nitride added were made to be 2.5-fold mol and 0.5-fold mol, respectively, to that of the zirconium dioxide, the reaction gas was made to be a mixed gas of a nitrogen gas and an ammonia gas, and sintering was carried out under an atmosphere of the mixed gas with a ratio of these ($N_2$:$NH_3$) in terms of % by volume of 80%:20% at a temperature of 750° C. for 30 minutes to obtain a sintered product. Except for that, using the same raw materials as in Example 1, a zirconium nitride powder was obtained in the same manner as in Example 1.

Example 5

Amounts of the metallic magnesium and the magnesium nitride added were made to be 3.5-fold mol and 0.5-fold mol, respectively, to that of the zirconium dioxide, the reaction gas was made to be a mixed gas of a nitrogen gas and an ammonia gas, and sintering was carried out under an atmosphere of the mixed gas with a ratio of these ($N_2$:$NH_3$) in terms of % by volume of 80%:20% at a temperature of 700° C. for 60 minutes to obtain a sintered product. Except for that, using the same raw materials as in Example 1, a zirconium nitride powder was obtained in the same manner as in Example 1.

Example 6

To the zirconium dioxide powder having an average primary particle diameter of 40 nm to which silica has been coated in the same manner as in Example 3 so that silica ($SiO_2$) was to be contained with 10.0% by mass in the zirconium dioxide were added 4.4 g of a metallic magnesium powder having an average primary particle diameter of 500 μm and 3.0 g of a magnesium nitride powder having an average primary particle diameter of 500 nm, and uniformly mixed in the same manner as in Example 1. At this time, amounts of the metallic magnesium and the magnesium nitride added were 3.0-fold mol and 0.5-fold mol, respectively, to that of the zirconium dioxide. The reaction gas was made to be a mixed gas of a nitrogen gas and a hydrogen gas, and sintering was carried out under an atmosphere of the mixed gas with a ratio of these ($N_2$:$H_2$) in terms of % by volume of 90%:10% at a temperature of 800° C. for 60 minutes to obtain a sintered product. Thereafter, a zirconium nitride powder was obtained in the same manner as in Example 1.

Example 7

A zirconium nitride powder was obtained in the same manner as in Example 1 and using the same raw materials used in Example 1 except for changing the amount of the metallic magnesium added to 2.0-fold mol to that of the zirconium dioxide.

Example 8

A zirconium nitride powder was obtained in the same manner as in Example 1 and using the same raw materials used in Example 1 except for changing the amount of the magnesium nitride added to 0.3-fold mol to that of the zirconium dioxide.

Example 9

A zirconium nitride powder was obtained in the same manner as in Example 1 and using the same raw materials used in Example 1 except for changing the amount of the magnesium nitride added to 3.0-fold mol to that of the zirconium dioxide.

Example 10

A zirconium nitride powder was obtained in the same manner as in Example 1 and using the same raw materials used in Example 1 except for changing the sintering temperature to 650° C.

Example 11

A zirconium nitride powder was obtained in the same manner as in Example 1 and using the same raw materials used in Example 1 except for changing the sintering temperature to 900° C.

Example 12

A zirconium nitride powder was obtained in the same manner as in Example 1 and using the same raw materials used in Example 1 except for changing the reaction gas to a mixed gas of a nitrogen gas and a hydrogen gas, and the atmosphere of the mixed gas with a ratio of these ($N_2$:$H_2$) in terms of % by volume of 50%:50%.

Example 13

A zirconium nitride powder was obtained in the same manner as in Example 1 and using the same raw materials used in Example 1 except for changing the reaction gas to a mixed gas of a nitrogen gas and an ammonia gas, and the atmosphere of the mixed gas with a ratio of these ($N_2$:$NH_3$) in terms of % by volume of 40%:60%.

Comparative Example 1

A fine particle lower zirconium oxide-zirconium nitride composite was obtained by a method according to the method shown in Example 1 of Patent Document 2. That is, 7.2 g of a zirconium dioxide powder having an average primary particle diameter of 19 nm and 3.3 g of a fine particle magnesium oxide having an average primary particle diameter of 20 nm were mixed and pulverized to obtain a mixed powder A. To 0.5 g of the mixed powder was added 2.1 g of a metallic magnesium powder having an average primary particle diameter of 150 μm and mixed to obtain a mixed powder B. At this time, amounts of the metallic magnesium and the magnesium oxide added were 1.4-fold mol and 1.4-fold mol, respectively, to that of the zirconium dioxide. This mixed powder B was sintered under an atmosphere of a nitrogen gas at a temperature of 700° C. for 60 minutes. Thereafter, a fine particle lower zirconium oxide-zirconium nitride composite was obtained in the same manner as in Example 1.

Comparative Example 2

A black powder of titanium black shown in Example 1 of Patent Document 1 was prepared. That is, a titanium oxide powder having an average primary particle diameter of 160 nm was sintered under an atmosphere of an ammonia gas at a temperature of 850° C. for 180 minutes to obtain titanium oxynitride ($TiO_{0.3}N_{0.9}$) of 70 nm, and then, an insulating powder comprising the titanium oxynitride and $Al_2O_3$ having an average primary particle diameter of 10 nm was added in an amount of 5.0 parts by mass based on 100 parts by mass of titanium oxynitride and mixed to prepare a black powder.

Comparative Example 3

To 7.8 g of a zirconium dioxide powder having an average primary particle diameter of 40 nm to which silica coating has been carried out in the same manner as in Example 2 so that silica ($SiO_2$) is contained in an amount of 11.0% by mass in the zirconium dioxide were added 4.6 g of a metallic magnesium powder having an average primary particle diameter of 150 μm and 3.2 g of a magnesium nitride powder having an average primary particle diameter of 100 nm, and uniformly mixed in the same manner as in Example 1. At this time, amounts of the metallic magnesium and the magnesium nitride added were 3.0-fold mol and 0.5-fold mol, respectively, to that of zirconium dioxide. It was sintered by making the reaction gas as the atmospheric gas to be 100% by volume of a nitrogen gas, at a temperature of 750° C. for 60 minutes to obtain a sintered product. Thereafter, a zirconium nitride powder was obtained in the same manner as in Example 1.

Comparative Example 4

To 7.2 g of a zirconium dioxide powder having an average primary particle diameter of 40 nm were added 7.1 g of a metallic magnesium powder having an average primary particle diameter of 150 μm and 2.9 g of a magnesium nitride powder having an average primary particle diameter of 200 nm, and uniformly mixed in the same manner as in Example 1. The reaction gas as the atmospheric gas was made to be 100% by volume of a nitrogen gas, and the sintering temperature was made 1,000° C., and the sintering time 60 minutes. Except for that, using the same raw materials as in Example 1, a zirconium nitride powder was obtained in the same manner as in Example 1.

Comparative Example 5

A zirconium nitride powder was obtained in the same manner as in Example 1 using the same raw materials as in Example 1 except for changing an added amount of the metallic magnesium to 1.5-fold mol of zirconium dioxide.

Comparative Example 6

A zirconium nitride powder was obtained in the same manner as in Example 1 using the same raw materials as in Example 1 except for changing an amount of the metallic magnesium to 6.5-fold mol of zirconium dioxide.

Comparative Example 7

A zirconium nitride powder was obtained in the same manner as in Example 1 using the same raw materials as in Example 1 except for changing an added amount of the magnesium nitride to 0.2-fold mol of zirconium dioxide.

Comparative Example 8

A zirconium nitride powder was obtained in the same manner as in Example 1 using the same raw materials as in Example 1 except for changing an added amount of the magnesium nitride to 3.5-fold mol of zirconium dioxide.

Comparative Example 9

A zirconium nitride powder was obtained in the same manner as in Example 1 using the same raw materials as in Example 1 except for changing the sintering temperature to 600° C.

Each of the producing method of Examples 1 to 13 and Comparative examples 1 to 9, a molar ratio of zirconium dioxide to the added amount of metallic magnesium, metallic nitride or magnesium oxide (hereinafter referred to as Mg source.), a kind and a ratio of additives, a kind of the reaction gas as the atmospheric gas and a ratio thereof in terms of % by volume, a sintering temperature and a sintering time are shown in Table 1.

TABLE 1

| | | Metallic | | | Producing conditions | | | |
| | | Mg/$ZrO_2$ (molar ratio) | $Mg_3N_2$/$ZrO_2$ (molar ratio) | MgO/$ZrO_2$ (molar ratio) | Kind of additive (% by mass) | Kind of reaction gas (vol % ratio) | Sintering temperature (° C.) | Sintering time (min) |
| | Producing method | | | | | | | |
| --- | --- | --- | --- | --- | --- | --- | --- | --- |
| Example 1 | Reduction by Mg | 5.0 | 0.5 | — | None | $N_2$ = 100% | 700 | 60 |
| Example 2 | Reduction Mg | 3.0 | 0.5 | — | None | $N_2$ + $H_2$ = 90%:10% | 700 | 30 |
| Example 3 | Reduction by Mg | 6.0 | 2.0 | — | $SiO_2$ 3.0% | $N_2$ = 100% | 700 | 60 |
| Example 4 | Reduction by Mg | 2.5 | 0.5 | — | None | $N_2$ + $NH_3$ = 80%:20% | 750 | 30 |
| Example 5 | Reduction by Mg | 3.5 | 0.5 | — | None | $N_2$ + $NH_3$ = 80%:20% | 700 | 60 |
| Example 6 | Reduction by Mg | 3.0 | 0.5 | — | $SiO_2$ 10.0% | $N_2$ + $H_2$ = 90%:10% | 800 | 60 |
| Example 7 | Reduction by Mg | 2.0 | 0.5 | — | None | $N_2$ = 100% | 700 | 60 |
| Example 8 | Reduction by Mg | 5.0 | 0.3 | — | None | $N_2$ = 100% | 700 | 60 |
| Example 9 | Reduction by Mg | 5.0 | 3.0 | — | None | $N_2$ = 100% | 650 | 60 |
| Example 10 | Reduction by Mg | 5.0 | 0.5 | — | None | $N_2$ = 100% | 650 | 60 |
| Example 11 | Reduction by Mg | 5.0 | 0.5 | — | None | $N_2$ = 100% | 900 | 60 |
| Example 12 | Reduction by Mg | 3.0 | 0.5 | — | None | $N_2$ + $H_2$ = 50%:50% | 700 | 60 |

TABLE 1-continued

| | | Metallic | | | Producing conditions | | | |
|---|---|---|---|---|---|---|---|---|
| | Producing method | Mg/ $ZrO_2$ (molar ratio) | $Mg_3N_2$/ $ZrO_2$ (molar ratio) | MgO/ $ZrO_2$ (molar ratio) | Kind of additive (% by mass) | Kind of reaction gas (vol % ratio) | Sintering temperature (° C.) | Sintering time (min) |
| Example 13 | Reduction by Mg | 3.0 | 0.5 | — | None | $N_2 + NH_3$ = 40%:60% | 700 | 60 |
| Comparative example 1 | Reduction by Mg | 1.4 | — | 1.4 | None | $N_2$ = 100% | 700 | 60 |
| Comparative example 2 | Titanium black | — | — | — | None | $NH_3$ = 100% | — | — |
| Comparative example 3 | Reduction by Mg | 3.0 | 0.5 | — | $SiO_2$ 11.0% | $N_2$ = 100% | 750 | 60 |
| Comparative example 4 | Reduction by Mg | 5.0 | 0.5 | — | None | $N_2$ = 100% | 1,000 | 60 |
| Comparative example 5 | Reduction by Mg | 1.5 | 0.5 | — | None | $N_2$ = 100% | 700 | 60 |
| Comparative example 6 | Reduction by Mg | 6.5 | 0.5 | — | None | $N_2$ = 100% | 700 | 60 |
| Comparative example 7 | Reduction by Mg | 5.0 | 0.2 | — | None | $N_2$ = 100% | 700 | 60 |
| Comparative example 8 | Reduction by Mg | 5.0 | 3.5 | — | None | $N_2$ = 100% | 700 | 60 |
| Comparative example 9 | Reduction by Mg | 5.0 | 0.5 | — | None | $N_2$ = 100% | 600 | 60 |

<Comparative Test and Evaluation 1>

The zirconium nitride powders obtained in Examples 1 to 13 and Comparative examples 3 to 9, the fine particle lower zirconium oxide-zirconium nitride composite obtained in Comparative example 1, and the black powder prepared in Comparative example 2 were used as samples, and (1) a specific surface area, (2) an X-ray diffraction profile, (3) a spectral curve of the dispersion with a powder concentration of 50 ppm, (4) light transmittance X at 370 nm and the light transmittance Y at 550 nm, and (5) X/Y were measured or calculated by the methods mentioned in detail below. The respective measurement results or calculation results are shown in Table 2. In Table 2, "$Zr_2N_2O$" means lower zirconium oxynitride, and "TiB" means titanium black.

(1) Specific surface area: With regard to all the samples, it was measured by using a specific surface area measuring apparatus (SA-1100, manufactured by SIBATA SCIENTIFIC TECHNOLOGY LTD.), by the BET 1 point method due to nitrogen adsorption.

(2) X-ray diffraction profile: With regard to the samples of Example 1 and Comparative example 1, by using an X-ray diffractometer (Model number: Miniflex II, manufactured by Rigaku Corporation), X-ray diffraction analysis was carried out from the X-ray diffraction profile by the θ-2θ method under conditions of an applied voltage of 45 kV and an applied current of 40 mA using CuKα ray. From the X-ray diffraction profile, the presence or absence of a peak corresponding to zirconium nitride (2θ=33.95°, 39.3°), a peak corresponding to zirconium dioxide (2θ=30.2°), a peak corresponding to lower zirconium oxide and a peak corresponding to lower zirconium oxynitride (2θ=30.5°, 35.3°) were examined. The X-ray diffraction profile was shown in FIG. 1. In FIG. 1, "ZrN" means zirconium nitride, and "$Zr_2N_2O$" means lower zirconium oxynitride, respectively.

Figure 2:
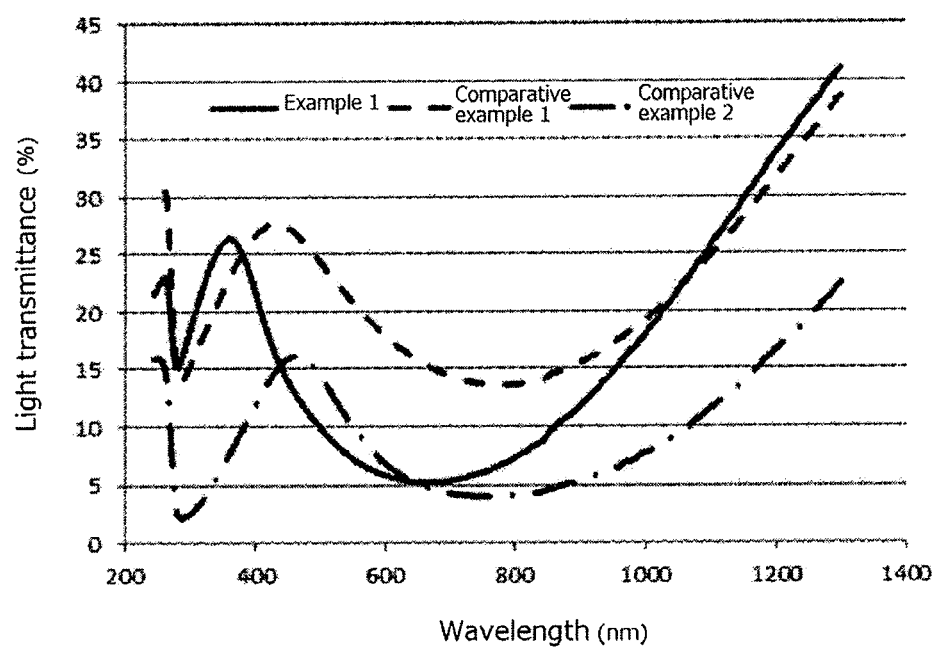
FIG. 2 is a spectral curve showing light transmittance in dispersed liquids obtained in Example 1 of the present invention and Comparative examples 1 and 2 by diluting the dispersed liquids to a powder concentration of 50 ppm.

(3) Spectral curve of dispersion with powder concentration of 50 ppm: With respect to each of the samples of Examples 1 to 13 and Comparative examples 1 to 9, these samples were separately placed in a circulating horizontal type bead mill (media:zirconia), an amine-based dispersing agent was added thereto, and dispersing treatment was carried out in a solvent of propylene glycol monomethyl ether acetate (PGM-AC). The obtained 22 kinds of dispersions were diluted 100,000-fold and a powder concentration was adjusted to 50 ppm. The light transmittance of each sample in this diluted dispersion was measured in the range of the wavelength from 240 nm to 1,300 nm using Hitachi High-Tech Fielding Corporation (UH-4150), and each of the light transmittance (%) at the wavelength of 370 nm near i-line (365 nm) and at the wavelength of 550 nm was measured. In FIG. 2, three spectral curves of Example 1 and Comparative examples 1 and 2 are shown.

(4) Light transmittance X at 370 nm and light transmittance Y at 550 nm: The respective light transmittances X and Y were read from spectral curves of each of the samples of Examples 1 to 13 and Comparative examples 1 to 9.

(5) X/Y: X/Y was calculated from the light transmittance X and the light transmittance Y read from the spectral curves of each of the samples of Examples 1 to 13 and Comparative examples 1 to 9.

TABLE 2

| | Final product | | Presence or absence of peak of X-ray diffraction profile | | | Dispersion transmitted spectrum with powder concentration of 50 ppm | | | OD value | |
|---|---|---|---|---|---|---|---|---|---|---|
| | Kind | Specific surface area ($m^2/g$) | Position corresponding to ZrN | Position corresponding to $ZrO_2$ | Position corresponding to $Zr_2N_2O$ | Light transmittance X (370 nm) | Light transmittance Y (550 nm) | X/Y | UV transmittance (370 nm) | Visible ray shielding property (560 nm) |
| Example 1 | ZrN | 35 | Present | None | None | 26.0 | 7.3 | 3.56 | Excellent | Excellent |
| Example 2 | ZrN | 45 | Present | None | None | 27.0 | 8.0 | 3.31 | Excellent | Good |
| Example 3 | ZrN | 65 | Present | None | None | 20.7 | 4.6 | 4.50 | Good | Excellent |
| Example 4 | ZrN | 35 | Present | None | None | 27.0 | 9.5 | 2.84 | Excellent | Good |
| Example 5 | ZrN | 40 | Present | None | None | 24.0 | 6.5 | 3.69 | Good | Excellent |
| Example 6 | ZrN | 90 | Present | None | None | 30.0 | 12.0 | 2.50 | Excellent | Good |
| Example 7 | ZrN | 32 | Present | None | None | 23.0 | 7.0 | 3.83 | Good | Excellent |
| Example 8 | ZrN | 20 | Present | None | None | 18.1 | 6.9 | 2.61 | Good | Excellent |
| Example 9 | ZrN | 68 | Present | None | None | 19.8 | 6.5 | 3.00 | Good | Excellent |
| Example 10 | ZrN | 42 | Present | None | None | 28.0 | 10.1 | 2.78 | Excellent | Good |
| Example 11 | ZrN | 22 | Present | None | None | 18.0 | 6.0 | 3.00 | Good | Excellent |
| Example 12 | ZrN | 35 | Present | None | None | 23.0 | 9.2 | 2.50 | Excellent | Good |
| Example 13 | ZrN | 30 | Present | None | None | 24.0 | 9.6 | 2.50 | Excellent | Good |
| Comparative example 1 | ZrOx + ZrN | 25 | Present | None | Present | 24.1 | 20.8 | 1.16 | Excellent | Poor |
| Comparative example 2 | TiB | 21 | None | None | None | 8.8 | 10.0 | 0.88 | Poor | Good |
| Comparative example 3 | ZrN | 95 | Present | None | Present | 30.0 | 12.0 | 1.94 | Excellent | Poor |
| Comparative example 4 | ZrN | 10 | Present | None | None | 31.0 | 13.0 | 2.38 | Excellent | Poor |
| Comparative example 5 | ZrN | 72 | Present | None | Present | 31.0 | 18.0 | 1.72 | Excellent | Poor |
| Comparative example 6 | ZrN | 15 | Present | None | None | 17.0 | 7.1 | 2.40 | Poor | Excellent |
| Comparative example 7 | ZrN | 13 | Present | None | None | 18.0 | 8.0 | 2.25 | Poor | Good |
| Comparative example 8 | ZrN | 55 | Present | None | Present | 30.0 | 13.1 | 2.29 | Excellent | Poor |
| Comparative example 9 | ZrN | 41 | Present | Present | Present | 32.0 | 14.0 | 2.28 | Excellent | Poor |

As clearly seen from FIG. 1, the sample of Comparative example 1 had, in the X-ray diffraction profile, not only the peak corresponding to zirconium nitride (2θ=33.95°, 39.3°), but also the peak corresponding to lower zirconium oxynitride (2θ=30.5°, 35.3°). To the contrary, the sample of Example 1 had a peak corresponding to zirconium nitride in the X-ray diffraction profile, while neither a peak corresponding to zirconium dioxide, a peak corresponding to lower zirconium oxide nor a peak corresponding to lower zirconium oxynitride was present.

As is apparent from FIG. 2 and Table 2, the samples of Comparative example 1 and Comparative example 2 had the transmittance at 370 nm in the spectral transmission curve of 24.1% and 8.8%, respectively, and the transmittance at 550 nm of 20.8% and 10.0%, respectively. To the contrary, the transmittance at 370 nm in the spectral transmission curve of the sample of Example 1 was 26.0%, which was higher than those of Comparative examples 1 and 2, and the transmittance at 550 nm was 7.3%, which was lower than those of Comparative examples 1 and 2. Also, with regard to (X/Y) of the light transmittance Y at 550 nm with respect to the light transmittance X at 370 nm, as is clear from Table 2, Comparative examples 1 to 9 do not satisfy the requirement of the present invention, so that they were all less than 2.5. To the contrary, Examples 1 to 13 satisfied the requirements of the present invention and all were 2.5 or more. From the above, it could be understood that the samples of Examples 1 to 13 had high light shielding property of visible light and transmit ultraviolet rays, so that they were advantageous for patterning.

<Comparative Test and Evaluation 2>

With regard to the samples obtained in Examples 1 to 13 and Comparative examples 1 to 9, an acrylic resin was mixed with a dispersed liquid used for measurement of the light transmittance with a ratio of black pigment:resin=6:4 by mass ratio to prepare a black photosensitive composition. This composition was spin-coated on a glass substrate so as to have a film thickness after sintering of 1 μm and sintered at a temperature of 250° C. for 60 minutes to form a film. The OD values of ultraviolet rays (central wavelength of 370 nm) and visible light (central wavelength of 560 nm) of the film were measured using a densitometer (densitometer) of a product name of D200 manufactured by Macbeth Co. based on the above-mentioned formula (1). The results are shown in Table 2. In Table 2, as a measure indicating the transmittance of ultraviolet rays, the OD value at 370 nm of ultraviolet rays (UV) of 2.0 or less is made "excellent", exceeding 2.0 and 2.5 or less is made "good", and exceeding 2.5 is made "poor". Also, as a measure indicating the light shielding property of visible light, the case where the OD value at 560 nm of visible light of exceeding 4.5 is made "excellent", 3.8 or more and 4.5 or less is made "good", and less than 3.8 is made "poor".

As is apparent from Table 2, with respect to the OD value as a measure showing the transmittance of the ultraviolet rays and light shielding property of the visible light, the sample of Comparative example 1 had insufficient reduction of zirconium dioxide, so the OD value at 560 nm of the visible light was low and it was "poor". Also, the titanium black sample of Comparative example 2 had insufficient ultraviolet ray transmittance, so that the OD value at 370 nm of UV was high and it was "poor". Also, the sample of Comparative example 3 contained a large amount of silica, so that the OD value at 560 nm of the visible light was low and it was "poor".

Also, the sample of Comparative example 4 was coarse in particle size due to high sintering temperature, the OD value at 560 nm of visible light was low and it was "poor". In addition, in the sample of Comparative example 5, the ratio of the metallic magnesium was too small and reduction of the zirconium dioxide was insufficient, so that the OD value at 560 nm of visible light was low and it was "poor". Further, in the sample of Comparative example 6, the ratio of the metallic magnesium was too large and the particle size became coarse, so that the OD value at 370 nm of UV was high and it was "poor".

Also, in the sample of Comparative example 7, the ratio of the magnesium nitride was too small and it did not prevent sintering of zirconium nitride, so that the OD value at 370 nm of UV was high and it was "poor". In addition, in the sample of Comparative example 8, the ratio of the magnesium nitride was too large and lower zirconium oxynitride was contained, so that the OD value at 560 nm of visible light was low and it was "poor". Further, in the sample of Comparative example 9, the sintering temperature was too low and reduction of the zirconium dioxide did not cause sufficiently, so the OD value at 560 nm of visible light was low and it was "poor".

To the contrary, the samples of Examples 1 to 13 satisfied the requirement of the present invention, so that the OD value at 370 nm of ultraviolet rays (UV) was "excellent" or "good", and the OD value at 560 nm of visible light was also "excellent" or "good". From these facts, it was found that the samples of Examples 1 to 13 were advantageous for patterning because they transmitted ultraviolet rays in addition to high light shielding property of visible light.

UTILIZABILITY IN INDUSTRY

The zirconium nitride powder of the present invention can be utilized for a high precision liquid crystal, a black matrix material for organic EL, a light shielding material for an image sensor, a light shielding material for an optical material, a light shielding filter, an IR cut filter, and the like.

The invention claimed is:

1. A method for producing a zirconium nitride powder which comprises:
   mixing a zirconium dioxide powder onto which silica has been coated, a metallic magnesium powder, and a magnesium nitride powder so that the metallic magnesium becomes a ratio of 2.0 to 6.0-fold mol with respect to the zirconium dioxide, and the magnesium nitride becomes a ratio of 0.3 to 3.0-fold mol with respect to the zirconium dioxide to obtain a mixture, and then
   sintering the mixture in an atmosphere of a nitrogen gas alone, or a mixed gas of a nitrogen gas and a hydrogen gas, or a mixed gas of a nitrogen gas and an ammonia gas at a temperature of 650 to 900° C., to reduce the zirconium dioxide powder,
   wherein the zirconium nitride powder has:
   a specific surface area of 40 to 90 $m^2/g$ as measured by a BET method,
   a peak corresponding to zirconium nitride but does not have:
      a peak corresponding to zirconium dioxide,
      a peak corresponding to lower zirconium oxide, and
      a peak corresponding to lower zirconium oxynitride
      in an X-ray diffraction profile;
   a light transmittance X at 370 nm of at least 18%,
   a light transmittance Y at 550 nm of 12% or less, and
   a ratio (X/Y) of the light transmittance X at 370 nm to the light transmittance Y at 550 nm is 2.5 or more in a transmission spectra of a dispersion that contains the powder at a concentration of 50 ppm;
   wherein the zirconium nitride powder contains silicon oxide and/or silicon nitride at a ratio of 2.7% by mass or more and 10.0% by mass or less, and
   wherein the zirconium dioxide powder onto which silica has been coated is obtained by:
      mixing a zirconium dioxide powder with water or an alcohol to prepare a dispersing liquid,
      admixing the dispersing liquid with a silicate sol-gel liquid to prepare a slurry, and
      drying and pulverizing the slurry.

2. The method for producing the zirconium nitride powder according to claim 1, wherein the hydrogen gas is contained in an amount of 0 to 4.0% by volume in the mixed gas of the nitrogen gas and the hydrogen gas, and the ammonia gas is contained in an amount of 0 to 50% by volume in the mixed gas of the nitrogen gas and the ammonia gas.

3. A black photosensitive composition which comprises the zirconium nitride powder according to claim 1 as a black pigment.

4. A method for forming a black patterning film using the black photosensitive composition according to claim 3.

5. A black photosensitive composition which comprises the zirconium nitride powder according to claim 2 as a black pigment.

6. The method for producing the zirconium nitride powder according to claim 1, wherein a mixing ratio of the zirconium dioxide and the sol-gel liquid is determined so that a concentration of a solid content of the obtained slurry is 10 to 50% by mass as the solid content.

7. The method for producing the zirconium nitride powder according to claim 1, wherein the silicate sol-gel liquid is a liquid in which methyl silicate or ethyl silicate is dissolved in water or an alcohol.

* * * * *

UNITED STATES PATENT AND TRADEMARK OFFICE
CERTIFICATE OF CORRECTION

| | | |
|---|---|---|
| PATENT NO. | : 11,577,958 B2 | Page 1 of 1 |
| APPLICATION NO. | : 16/336634 | |
| DATED | : February 14, 2023 | |
| INVENTOR(S) | : Kensuke Kageyama et al. | |

It is certified that error appears in the above-identified patent and that said Letters Patent is hereby corrected as shown below:

In the Claims

Column 20, Line 45 please change "to 4.0%" to -- to 40% --

Signed and Sealed this
Eighteenth Day of July, 2023

Katherine Kelly Vidal
*Director of the United States Patent and Trademark Office*